US 6,717,396 B2

(12) United States Patent
Viola

(10) Patent No.: US 6,717,396 B2
(45) Date of Patent: Apr. 6, 2004

(54) HOUSING WITH RETAINER TAB FOR POSITIONING A CURRENT SENSOR MAGNETIC FIELD CONCENTRATING CORE

(75) Inventor: Jeffrey Louis Viola, Berkley, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 44 days.

(21) Appl. No.: 10/293,512

(22) Filed: Nov. 13, 2002

(65) Prior Publication Data

US 2003/0169031 A1 Sep. 11, 2003

Related U.S. Application Data

(63) Continuation-in-part of application No. 10/093,190, filed on Mar. 7, 2002, now Pat. No. 6,570,373.

(51) Int. Cl.$^7$ ............................................... G01R 33/00
(52) U.S. Cl. .......................... 324/117 R; 324/117 H; 324/158.1
(58) Field of Search .................... 324/117 R, 117 H, 324/158.1; 361/142, 144, 600

(56) References Cited

U.S. PATENT DOCUMENTS

| | | | |
|---|---|---|---|
| 4,021,729 A | * | 5/1977 | Hudson, Jr. ................. 324/509 |
| 4,901,008 A | | 2/1990 | Quastel et al. |
| 5,057,769 A | | 10/1991 | Edwards |
| 5,146,156 A | | 9/1992 | Marcel |
| 5,493,211 A | | 2/1996 | Baker |
| 5,923,162 A | | 7/1999 | Drafts et al. |
| 5,986,444 A | * | 11/1999 | Powell ..................... 324/117 R |
| 6,348,800 B1 | * | 2/2002 | Haensgen et al. ........... 324/500 |
| 6,437,555 B1 | * | 8/2002 | Pioch et al. ................. 324/127 |
| 6,611,137 B2 | * | 8/2003 | Haensgen et al. ....... 324/117 H |

* cited by examiner

Primary Examiner—Kamand Cuneo
Assistant Examiner—Tung x. Nguyen
(74) Attorney, Agent, or Firm—MacMillan, Sobanski & Todd, LLC

(57) ABSTRACT

An sensor for sensing electrical current flowing in a conductor includes a housing for retaining a toroidal core formed of a ferric material and having a slot defining an air gap, and a Hall Effect sensor integrated circuit chip positioned in the air gap for sensing electrical current flowing in a conductor received in a central aperture of the core. The central aperture is defined by an annular portion of the housing formed by inner and outer walls joined by a floor and retaining the core. A tab in the annular portion extends into the core slot to limit movement of the core and protect the integrated circuit chip.

16 Claims, 3 Drawing Sheets

HOUSING WITH RETAINER TAB FOR POSITIONING A CURRENT SENSOR MAGNETIC FIELD CONCENTRATING CORE

CROSS-REFERENCE TO RELATED APPLICATION

This application is a continuation-in-part of the co-pending U.S. patent application Ser. No. 10/093,190, filed Mar. 7, 2002 now U.S. Pat. No. 6,570,373.

FIELD OF THE INVENTION

The present invention relates generally to an apparatus for calibrating electric current sensors and, in particular, to a current sensor assembly.

BACKGROUND OF THE INVENTION

Prior art analog based current sensors are designed to operate in a fixed range of current magnitudes. The lack of programmability means that multiple variations of current sensors need to be manufactured to accommodate applications requiring different current sensing ranges. Further, the prior art current sensors set the device gains/offsets by scribing resistive elements before final assembly or adjusting potentiometers. Both of these methods have drawbacks.

SUMMARY OF THE INVENTION

The present invention concerns an apparatus for calibrating sensors of electric current to ease problems brought on by part and process variations which affect sensor performance. The apparatus according to the present invention affords these sensors the flexibility to be calibrated to measure current levels in different working ranges appropriate for given applications. The innovative apparatus incorporates into the design of the sensor a Hall-effect magnetic field transducer element that enables the current measurement response function of the sensor to be programmed via the electrical interface connection of the sensor device. The primary parameters to be set via the connector interface are the transducer gain and offset.

The apparatus for sensing electrical current flowing in a conductor includes a toroidal core formed of a ferric material and having a slot extending through the core defining an air gap, the core having a central aperture, and an electrical current carrying conductor received in said central aperture, said core concentrating in said air gap magnetic flux generated by electrical current flowing in said conductor. A power supply is connected to the conductor for generating a known electrical current in the conductor and a Hall Effect sensor integrated circuit is positioned in the air gap and has a power supply pin and an output pin. A programming means is connected to the power supply pin and the output pin, whereby the integrated circuit responds to an application of a lower voltage first signal applied at the power supply pin by the programming means by generating at the output pin an output signal representing an amount of the known current flowing in the conductor and the integrated circuit responds to a higher voltage second signal applied at the power supply pin by accepting a programming signal applied at the output pin and calibrating the output signal in response to the programming signal.

The benefits of incorporating a sensing element programmable through the connector include: a) the ability to eliminate part-to-part variability and process variation of the end-of-line packaged units; and b) programmability allows the setting of both gain and offset after complete assembly thus permitting a single hardware implementation to meet the working electrical current ranges for different applications. The programmability enables the manufacturer to reduce the number of versions of parts needed to accommodate customer applications, thereby reducing costs.

Incorporation of the means to program the electric current sensor through the external electrical connector after final assembly bypasses the problems associated with the prior art current sensors in an economical and easily manufacturable way.

The current sensor assembly includes a housing having an annular portion for receiving the toroidal core. A tab is formed in the housing and extends into the core slot to align the core and prevent rotation of the core about its axis. The Hall Effect sensor integrated circuit is in the form of a chip that is positioned in the core slot adjacent to the tab. The tab and the chip are generally aligned in a plane extending radially from the axis of the annular portion of the housing. The tab has a thickness greater than a maximum thickness of the chip to function as a stop preventing the core from contacting the chip.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

Figure 1:
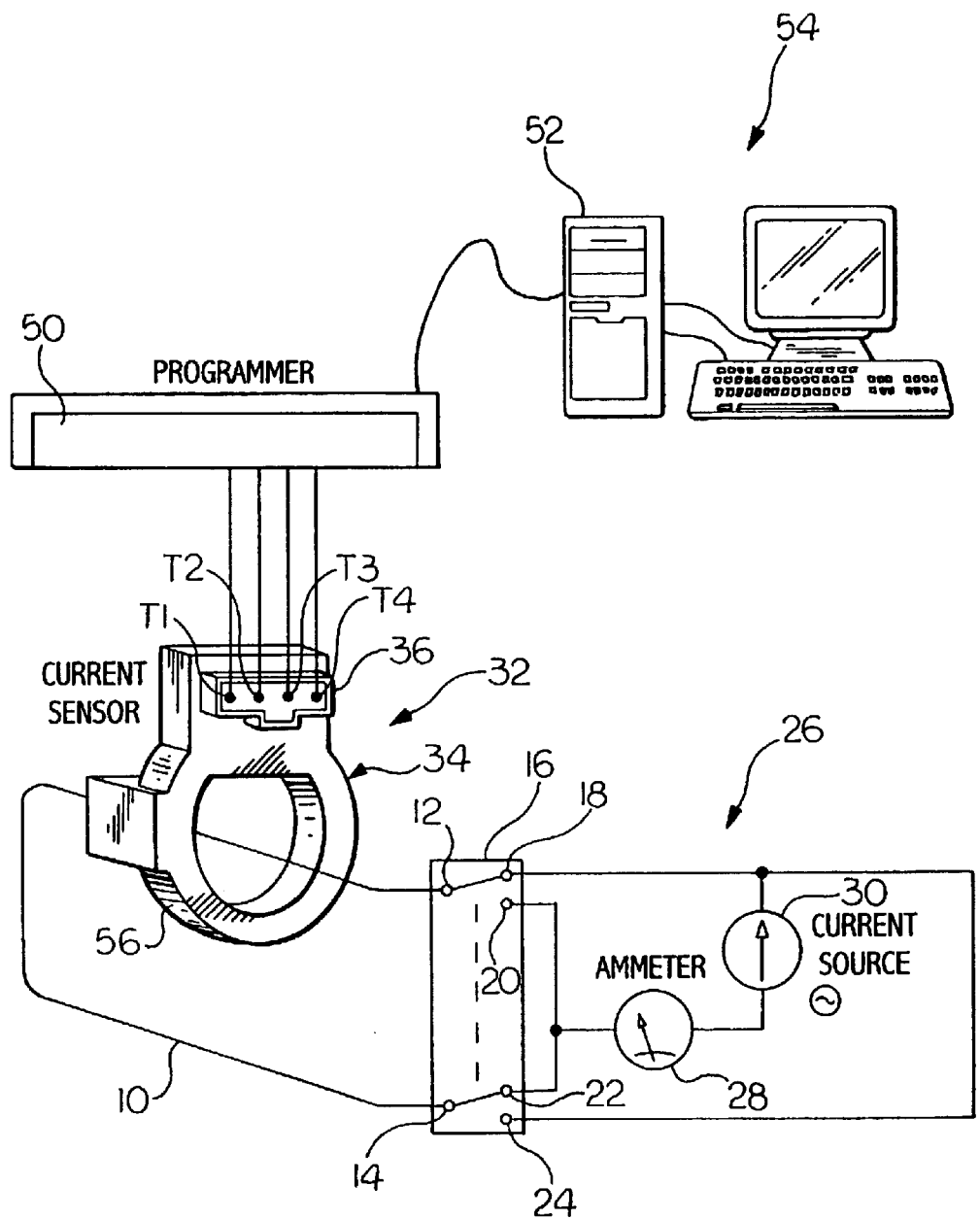
FIG. 1 is a schematic view of a current sensing apparatus in accordance with the present invention.

There is shown in FIG. 1 an electrical current flow path 10 for which it is desired to sense the parameters of the current flowing along the path. The path 10 is representative of any circuit configuration such as an electronic module to be tested for proper operation after assembly or a winding of an electric motor to be monitored for current flow. Opposite ends of the path 10 are releasably connected to a pair of switch terminals 12 and 14 of a double pole double throw (DPDT) switch 16. The first terminal 12 is associated with a first pole of the switch 16 and can be switched between a first contact 18 and a second contact 20. The second terminal 14 is associated with a second pole of the switch 16 and can be switched between a third contact 22 and a fourth contact 24. As shown, the poles are switched simultaneously so that, for example, when the terminal 12 is connected to the contact 18, the terminal 14 is connected to the contact 22.

The DPDT switch 16 is included in a test and calibration circuit 26 having an ammeter 28 and a current source 30 connected in series. The second contact 20 and the third contact 22 are connected to one terminal of the ammeter 28 having another terminal connected to a terminal of the current source 30. Another terminal of the current source 30 is connected to the first terminal 18 and the fourth terminal 24. The current source 30 can generate AC or DC current as required for testing and calibrating the current sensor described below. In the position of the switch 16 shown in FIG. 1, the first terminal 12 is connected to the current source 30 and the second terminal 14 is connected to the ammeter. Switching the switch 16 reverses the connections of the power supply 26 to the current flow path 10. Thus, the polarity of DC current supplied to the current path 10 can be reversed.

Figure 2:
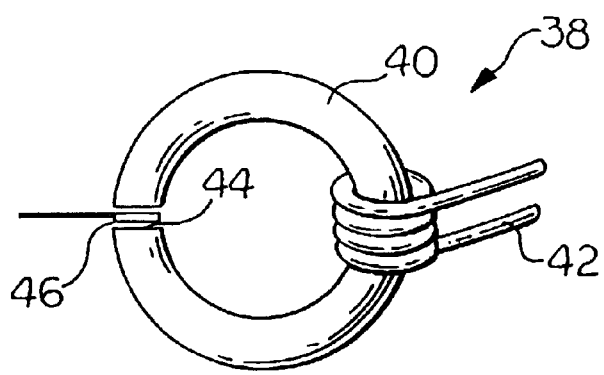
FIG. 2 is a schematic view of a current sensor pickup used in the apparatus shown in FIG. 1.

Current flowing in the path 10 is sensed by an electric current sensor 32 according to the present invention. The sensor 32 includes an annular housing 34 having a terminal block 36 mounted on an exterior surface thereof. The housing 34 is formed of a suitable material, such as a molded plastic material, and encloses an inductive pickup 38 shown in FIG. 2. The pickup 38 includes a slotted (ferric or soft magnetic) ferrite core 40 extending through a source winding 42. Positioned in a slot 44 of the core 40 is a programmable linear Hall Effect sensor integrated circuit 46, for example, a MLX90237 chip manufactured by Melexis and available in the United States from Dominion Group of Fishers, IN. This IC utilizes a single chip and is digitally programmable through its electrical leads that are connected to the terminal block 36. The IC is chopper stabilized and the use of a chopper stabilized Hall Effect IC increases stability and drift of the current sensor around zero applied currents (applied magnetic fields) resulting in a more accurate sensor.

Figure 3:
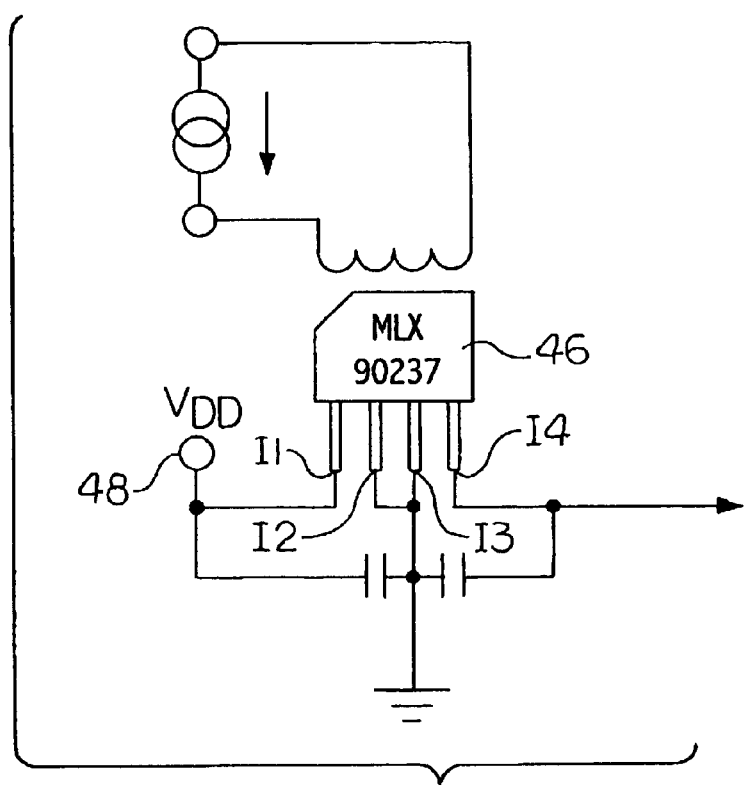
FIG. 3 is a circuit schematic of the programmable integrated circuit shown in FIG. 3.

A schematic circuit diagram of the connections of the IC 46 is shown in FIG. 3. A supply voltage pin I1 is connected to a positive potential terminal of a supply voltage source 48. A variable voltage supply is used to control the operation of the IC 46 as explained below. A pin 12 is a test pin for readback diagnostic use only. A pin 13 is connected to the circuit ground potential. An output pin 14 is used for a sensed current output signal of the IC and can be changed to an input.

The electric current sensor 38 is an inductive pickup (non-invasive) device. A wire (current path 10 in FIG. 1 and wire 42 in FIG. 2) carrying the current to be measured is passed through the center of the C-shaped steel toroid 40. Inserted into the flux gap 44 of the split toroid 40 is the digitally programmable Hall Effect IC 46. Following the completed assembly of the current sensor 32 (FIG. 1), with the pins of the IC 46 accessible at the terminal block 36, the output offset, gain and temperature compensation of the IC 46 can be adjusted and set. The pin 11 is connected to a terminal T1, the pins 12 and 13 are connected to a pair of terminals T2 and T4, and the pin 14 is connected to the terminal T3.

A programming technique allows the normally analog signal measurement output pin 14 connected to the terminal T3 to be utilized as a digital serial data input to the IC 46. For example, when the supply voltage at the terminal T1 is in the range of 4.5V to 5.5V, the output at the terminal T3 behaves normally. When the supply voltage is raised to 13V, the pin I4 connected to the terminal T3 functions as an input allowing a 31-bit word programming signal to be clocked in. All data is loaded through a single line in a load sequence with no dedicated clock signal. The clock and data are integrated into one programming signal that is initiated with the beginning of the load sequence and clocked with the positive edge of each bit. No extra auxiliary programming interface pins are required. Also avoided is the expense of potentiometer adjustment or resistor laser trimming. Part-to-part variability is improved and cost is reduced.

There is shown in FIG. 1 a programmer 50 manufactured by Melexis as a model PTC-01 for programming the IC 46. Programming ports of the programmer 50 are connected to the terminals T1 through T3 on the terminal block 36. An RS232 serial interface port is connected with a processor 52 of a personal computer 54. The computer 54 runs standard windows based Melexis software for programming the IC 46. The software and the programmer 50 permit the user to load magnetic response function settings, take measurements, and calibrate the sensor 32. Using the test and calibration circuit 26, the sensor 32 can be programmed to operate with a wide variety of current flow paths 10. For example, a separate one of the sensors 32 can be associated with each current flow path of a polyphase electric motor to generate feedback signals to a controller. Each of the sensors 32 can be calibrated to the associated current flow path after installation. The sensor 32 can be used with different size electric motors by programming the current range to be sensed.

The slotted core 40 is generally circular in cross section and is held in place in the plastic housing 34 by an integrally molded tab (shown in FIGS. 4–6) extending into the slot 44. The tab is smaller than the slot 44 yet larger than the width of the Hall IC 46. This serves to align the core 40 as it constrains rotation of the core and enables the use of the circular cross section core instead of the more traditional rectangular core. A circular cross section core is less costly to manufacture than a rectangular core. Also, there is a more uniform field density in a circular toroidal core, an attribute that improves performance and reduces the amount of material needed for the core.

Figure 4:
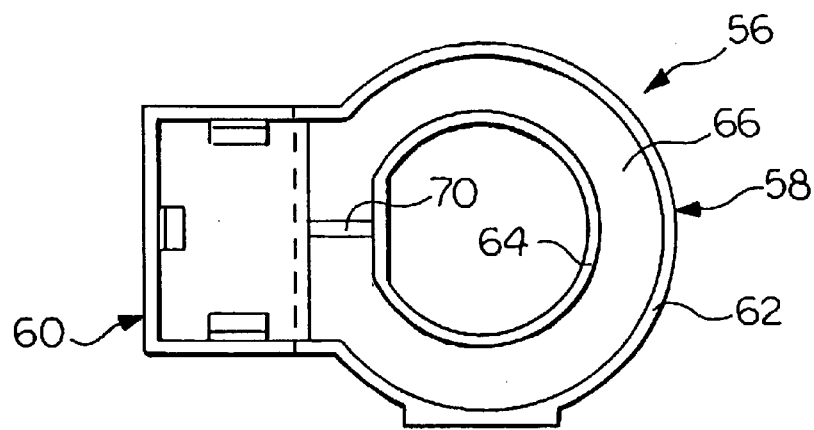
FIG. 4 is a plan view of a body of the housing shown in FIG. 1 with the cover removed.
Figure 5:
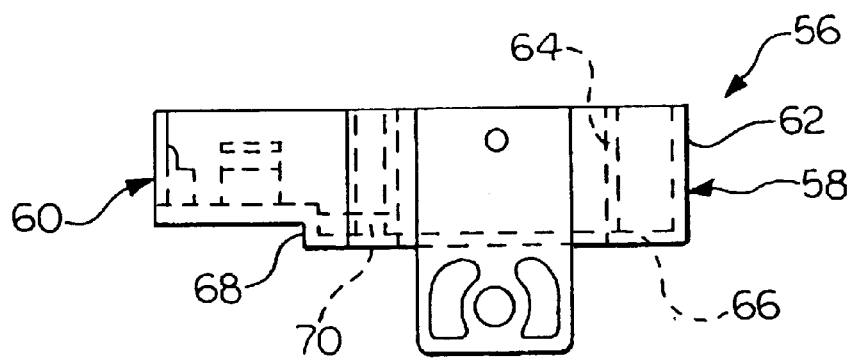
FIG. 5 is a side elevation view of the housing body shown in FIG. 4.

In FIGS. 4 and 5, a body 56 of the housing 34 is shown as including a generally annular portion 58 connected to a generally rectangular portion 60. A periphery of the body 56 is defined by an outer side wall 62 and the annular portion 58 has a central aperture defined by an inner side wall 64. The walls 62 and 64 are connected at one edge by a rear wall or floor 66 closing one side of the housing 56 while the opposite side of the housing is open and is adapted to be closed by a generally planar cover as shown in FIG. 1. The annular portion 58 has a greater depth than the rectangular portion 60 forming a step 68 in the floor 66 adjacent the junction of the housing body portions.

A tab 70, as described above, extends upwardly from the floor 66 and is connected between the inner wall 64 and the step 68. The tab 70 is generally planar and extends radially through an axis of rotation of the annular portion 58. As shown in FIG. 5, the tab 70 is shorter than the step 68. The housing body 56 is shown in cross section in FIG. 6 with the core 40 and the integrated circuit chip 46 installed. The core 40 is sized to fit between the walls 62 and 64 oriented such that the slot 44 is aligned with the tab 70. The chip 46 is positioned adjacent to the tab 70 in the same plane. The core 40 is free to move within the annular portion 58 under the influence of vibration and the like with the tab 70 functioning to limit rotation of the core about its axis which is generally aligned with the axis of rotation of the annular portion 58.

A width of the slot 44 is selected to provide clearance for the tab 70 at the dimensional tolerance limits of the narrowest slot and the thickest tab. The thickness of the tab 70 is selected to be greater than a maximum thickness of the chip 46 so that the core 40 will not come into contact with the chip. For example, a maximum thickness of the chip 46 can be 1.20 mm and the minimum width of the slot 44 can be approximately 2.29 mm which could narrow to approximately 2.08 mm due to core expansion at the highest operating temperature. Thus, the tab 70 should have a thickness of between 1.20 mm and 2.08 mm, such as approximately 1.90 mm.

Figure 6:
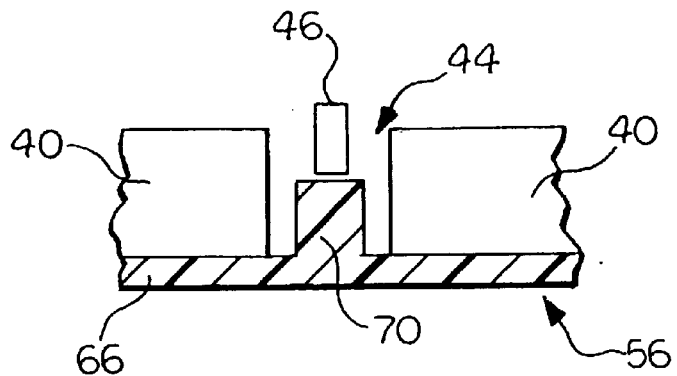
FIG. 6 is an enlarged fragmentary cross-sectional view of the tab area of the housing body shown in FIG. 4 with a core and an integrated circuit chip installed.

The integrated circuit chip 46 is typically mounted on a printed circuit board (not shown) received in the rectangular portion 60 so as to suspend the chip in the slot 44 as shown in FIG. 6. Like the core 40, the printed circuit board can be free to move inside the housing body 56, but any such movement should be in the same direction as the core moves thereby avoiding contact between the chip and the core.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A housing for mounting a toroidal core of an electrical current sensor comprising:

an outer wall defining a side wall of the housing;

an inner wall spaced from said outer wall;

a floor connected between said outer wall and said inner wall to close a rear side of the housing, said outer wall, said inner wall and said floor cooperating to define an annular portion of the housing; and a tab positioned in said annular portion and extending from said floor, said tab having a thickness less than a minimum width of a cooperating slot formed in a toroidal core whereby when the toroidal core is mounted in said annular portion with the slot aligned with said tab, said tab limits movement of the toroidal core in the housing.

2. The housing according to claim 1 wherein said outer wall, said inner wall, said floor and said tab are formed integral.

3. The housing according to claim 1 wherein said outer wall, said inner wall, said floor and said tab are formed of a plastic material.

4. The housing according to claim 1 wherein said tab is connected to said inner wall.

5. The housing according to claim 1 wherein said floor has a step formed therein and said tab extends between said inner wall and said step.

6. A housing for mounting a toroidal core and an integrated circuit chip of an electrical current sensor comprising:

an outer wall defining a side wall of the housing;

an inner wall spaced from said outer wall;

a floor connected between said outer wall and said inner wall to close a rear side of the housing, said outer wall, said inner wall and said floor cooperating to define an annular portion of the housing and a contiguous rectangular portion of the housing; and a tab positioned in said annular portion and extending from said floor, said tab having a thickness less than a minimum width of a cooperating slot formed in a toroidal core whereby when the toroidal core is mounted in said annular portion with the slot aligned with said tab, said tab limits movement of the toroidal core in the housing.

7. The housing according to claim 6 wherein said floor has a step formed therein and said tab extends between said inner wall and said step.

8. An apparatus for sensing electrical current flowing in a conductor comprising:

a housing having an annular portion, an outer wall circumscribing said housing, an inner wall spaced from said outer wall, said outer wall and said inner wall forming side walls of said annular portion, and a floor connected between said outer wall and said inner wall to close a rear side of said housing;

a toroidal core having a slot extending through said core defining an air gap, said core being positioned in said annular portion of said housing;

a Hall Effect sensor integrated circuit chip mounted in said housing and being positioned in said slot of said core; and a tab positioned in said annular portion and extending into said slot of said core, said tab having a thickness less than a minimum width of said slot and greater than a maximum thickness of said chip, said tab limiting movement of said core and preventing contact between said core and said chip.

9. The apparatus according to claim 8 wherein said housing is formed of a plastic material.

10. The apparatus according to claim 8 wherein said outer wall, said inner wall, said floor and said tab are formed integral.

11. The apparatus according to claim 8 wherein said tab is connected to said inner wall.

12. The apparatus according to claim 8 wherein said floor has a step formed therein and said tab extends between said inner wall and said step.

13. The apparatus according to claim 8 wherein said housing has a generally rectangular portion formed by said outer wall and said floor, said annular portion being in communication with said rectangular portion.

14. The apparatus according to claim 13 wherein said floor has a step formed therein adjacent a junction of said annular portion with said rectangular portion and said tab extends between said inner wall and said step.

15. The apparatus according to claim 8 wherein said chip is chopper stabilized.

16. The apparatus according to claim 8 wherein said chip is programmable for adjusting at least one of output offset, gain and temperature compensation.

* * * * *